(12) United States Patent
Zhang et al.

(10) Patent No.: US 12,745,508 B2
(45) Date of Patent: Sep. 22, 2026

(54) DISPLAY SUBSTRATE AND METHOD FOR PREPARING THE SAME, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wenqiang Zhang, Beijing (CN); Jiangrong Xie, Beijing (CN); Tianqi Lai, Beijing (CN); Leilei Wang, Beijing (CN); Kening Zheng, Beijing (CN); Yingchang Gao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 97 days.

(21) Appl. No.: 18/080,399

(22) Filed: Dec. 13, 2022

(65) Prior Publication Data

US 2023/0114312 A1 Apr. 13, 2023

Related U.S. Application Data

(63) Continuation of application No. 17/078,752, filed on Oct. 23, 2020, now Pat. No. 11,552,269.

(30) Foreign Application Priority Data

Dec. 20, 2019 (CN) ........................ 201911326576.6

(51) Int. Cl.
*H01L 51/00* (2006.01)
*H10K 50/11* (2023.01)
(Continued)

(52) U.S. Cl.
CPC ............. *H10K 50/11* (2023.02); *H10K 50/15* (2023.02); *H10K 59/122* (2023.02); *H10K 50/18* (2023.02);
(Continued)

(58) Field of Classification Search
CPC .. H10K 50/15; H10K 59/122; H10K 59/1201; H10K 50/11; H10K 71/00; H10K 2101/40
(Continued)

(56) References Cited

U.S. PATENT DOCUMENTS

2013/0248867 A1* 9/2013 Kim ..................... H10K 50/844 438/34
2014/0361260 A1* 12/2014 Kim .................... H10K 59/122 438/23
(Continued)

FOREIGN PATENT DOCUMENTS

CN 106449726 A 2/2017
CN 107293572 A 10/2017
CN 208157411 U 11/2018

OTHER PUBLICATIONS

Office Action of CN Application No. 201911326576.6 and English translation, Nov. 22, 2021, 13 pages.
(Continued)

*Primary Examiner* — Dzung Tran
(74) *Attorney, Agent, or Firm* — MUNCY, GEISSLER, OLDS & LOWE, P.C.

(57) ABSTRACT

The present disclosure relates to a display substrate, a method for preparing the same, and a display device. The display substrate of the present disclosure includes a base substrate, a pixel definition layer located on the base substrate, and a first pixel and a second pixel that are adjacent to each other and defined by the pixel definition layer, in
(Continued)

which a spacer function layer for blocking hole transport between adjacent pixels is arranged at at least a part of a contact interface between the second hole transport layer in the second pixel and the light function layer in the first pixel. By providing the spacer function layer, the present disclosure effectively prevents the migration of holes between the hole transport layers of adjacent pixels or between the hole transport layer and the light emitting layer, thereby avoiding accompanying light emission between adjacent pixels.

19 Claims, 3 Drawing Sheets

(51) Int. Cl.

*H10K 50/15* (2023.01)
*H10K 59/122* (2023.01)
*H10K 50/18* (2023.01)
*H10K 59/12* (2023.01)
*H10K 101/30* (2023.01)
*H10K 101/40* (2023.01)

(52) U.S. Cl.

CPC ..... *H10K 59/1201* (2023.02); *H10K 2101/30* (2023.02); *H10K 2101/40* (2023.02)

(58) Field of Classification Search

USPC ........................................................ 257/40
See application file for complete search history.

(56) References Cited

U.S. PATENT DOCUMENTS

2015/0144906 A1 5/2015 Ichikawa
2016/0155785 A1* 6/2016 Sato ...................... H10K 59/35 257/40
2016/0380035 A1 12/2016 Cho et al.
2017/0117337 A1 4/2017 Kimura et al.
2018/0151631 A1 5/2018 Lee et al.
2018/0151825 A1* 5/2018 Choi ...................... H10K 50/18
2018/0190732 A1 7/2018 Lee et al.
2018/0375052 A1 12/2018 Yang
2020/0395422 A1 12/2020 Xu

OTHER PUBLICATIONS

Office Action of U.S. Appl. No. 17/078,752, dated Jun. 1, 2022, 20 pages.
Office Action of U.S. Appl. No. 17/078,752, dated Mar. 14, 2022, 6 pages.

* cited by examiner

DISPLAY SUBSTRATE AND METHOD FOR PREPARING THE SAME, AND DISPLAY DEVICE

CROSS-REFERENCE TO RELATED APPLICATION

This application claims the benefit of and is a continuation application of U.S. patent application Ser. No. 17/078,752 filed on Oct. 23, 2020, which claims priority to Chinese Patent Application No. 201911326576.6 filed on Dec. 20, 2019, the disclosures of which are hereby incorporated by reference in their entireties.

TECHNICAL FIELD

The present disclosure relates to the field of display technology, to a display substrate and a method for preparing the same, and a display device including the display substrate.

BACKGROUND

An active matrix organic electroluminescent device (AM-OLED) is a new generation of display devices with a promising application prospect. OLED is a self-luminous device, in which an array of pixels is composed of three primary colors RGB. An active matrix organic electroluminescent device usually includes a substrate, an anode, an hole injection layer, a hole transport layer, a light emitting layer, an electron transport layer, an electron injection layer, and a cathode that are arranged in sequence. The light emitting principle of AM-OLED devices is shown as follows. When being driven by voltage, electrons are injected from a cathode into an electron transport layer, and then migrate to the light emitting layer through the electron transport layer; holes are injected from the anode to the transport layer, and then also migrate to the light emitting layer through the electron transport layer; and electrons and holes meet in the light emitting layer and form excitons, which excite light emitting molecules to emit visible light.

SUMMARY

In one aspect, the present disclosure provides a display substrate, including a base substrate, a pixel definition layer located on the base substrate, and a first pixel and a second pixel that are adjacent to each other and defined by the pixel definition layer, in which the first pixel includes a light function layer including a first hole transport layer, and the second pixel includes a second hole transport layer, and in which a spacer function layer for blocking hole transport between adjacent pixels is arranged at at least a part of a contact interface between the second hole transport layer and the light function layer.

Optionally, the light function layer includes the first hole transport layer and a first light emitting layer.

Optionally, the spacer function layer is arranged at the whole contact interface between the second hole transport layer and the light function layer.

Optionally, the spacer function layer is arranged between an anode of the second pixel and the second hole transport layer, the spacer function layer is connected to the first light emitting layer and the first hole transport layer, and the spacer function layer is arranged on a surface of the first light emitting layer away from the base substrate.

Optionally, a difference between an HOMO energy level of the spacer function layer and an HOMO energy level of the first hole transport layer is greater than 0.3 eV, and differences between the HOMO energy level of the spacer function layer and HOMO energy levels of the second light emitting layer as well as the second hole transport layer in the second pixel are both less than or equal to 0.3 eV.

Optionally, the spacer function layer is arranged on a surface of the first light emitting layer away from the first hole transport layer and between the second hole transport layer and the light function layer, and a part of the second hole transport layer is arranged on a surface of the spacer function layer away from the base substrate.

Optionally, the spacer function layer is arranged between the first light emitting layer and the first hole transport layer and between the first hole transport layer and the second hole transport layer, and the spacer function layer is in contact with the second hole transport layer.

Optionally, a part of the second hole transport layer is arranged on a surface of the first light emitting layer away from the base substrate.

Optionally, a difference between the HOMO energy level of the spacer function layer and an HOMO energy level of the second hole transport layer is greater than 0.3 eV, and differences between the HOMO energy level of the spacer function layer and an HOMO energy level of the first light emitting layer as well as the first hole transport layer are both less than or equal to 0.3 eV.

Optionally, the spacer function layer is made of a material having a decomposition temperature not less than 350° C., a hole mobility in a range from $10^{-5}$ to $10^{-3}$ $cm^2$ $v^{-1}s^{-1}$, and an electron mobility less than $10^{-9}$ $cm^2$ $v^{-1}s^{-1}$.

Optionally, the spacer function layer is made of at least one material selected from N,N'-Bis-(1-naphthalenyl)-N,N'-bis-phenyl-(1,1'-biphenyl)-4,4'-diamine (NPB), 2,2',7,7'-tetrakis(diphenylamino)-9,9'-spirobifluorene (spiro-TAD) and 2-(4-biphenylyl)-5-(4-tert-butylphenyl)-1,3,4-oxadiazole (PBD).

Optionally, the spacer function layer is in contact with the pixel definition layer and is arranged only between the first hole transport layer and the second hole transport layer; and the second hole transport layer is only in contact with the first light emitting layer rather than the first hole transport layer in a direction parallel to a surface of the base substrate.

In another aspect, the present disclosure provides a method for preparing a display substrate, including: forming an anode layer and a pixel definition layer on a base substrate, in which the pixel definition layer defines a first pixel area and a second pixel area that are adjacent to each other; sequentially forming a first hole transport layer and a first light emitting layer of the first pixel on the anode layer in the first pixel area; forming a spacer function layer for blocking hole transport between adjacent pixels, in which the spacer function layer at least covers an edge area of the light function layer in the first pixel proximate to the second pixel, and the light function layer at least includes the first hole transport layer; and sequentially forming a second hole transport layer and a second light emitting layer of the second pixel on the anode layer in the second pixel area.

Optionally, the light function layer includes a first hole transport layer and a first light emitting layer, and after the first light emitting layer is formed, a spacer function layer covering the first light emitting layer and the first hole transport layer is formed on the surface of the first light emitting layer.

Optionally, the light function layer includes a first hole transport layer and a first light emitting layer, and after the first light emitting layer is formed, a spacer function layer, a second hole transport layer and a second light emitting layer of the second pixel is sequentially formed on the anode layer in the second pixel area, in which the spacer function layer covers edge areas of the first hole transport layer and the first light emitting layer.

Optionally, after the first hole transport layer is formed, a spacer function layer is formed on a surface of the first hole transport layer, and the spacer function layer covers the first hole transport layer, and in which a difference between the HOMO energy level of the spacer function layer and an HOMO energy level of the second hole transport layer is greater than 0.3 eV, and differences between the HOMO energy level of the spacer function layer and HOMO energy levels of the first light emitting layer as well as the first hole transport layer are both less than or equal to 0.3 eV.

In another aspect, the present disclosure provides a display device including the display substrate as described above.

DESCRIPTION OF REFERENCE NUMERALS

1: pixel defining layer; 2: anode layer; 3: first hole transport layer; 4: first light emitting layer; 5: second hole transport layer; 6: second light emitting layer; 7: contact part; 8: spacer function layer; 1': pixel definition layer in the related art; 2': anode layer in the related art; 3': first hole transport layer in the related art; 4': first light emitting layer in the related art; 5': second hole transport layer in the related art; 6': second light emitting layer in the related art; 7': contact part in the related art; 9: overlap area between the first pixel and the second pixel.

DETAILED DESCRIPTION

In order to better understand the present disclosure, the optional embodiments of the present disclosure will be described below in combination with the detailed description, but it should be understood that these descriptions are merely used to further illustrate the features and advantages of the present disclosure and are not intended to limit the present disclosure.

Figure 1:
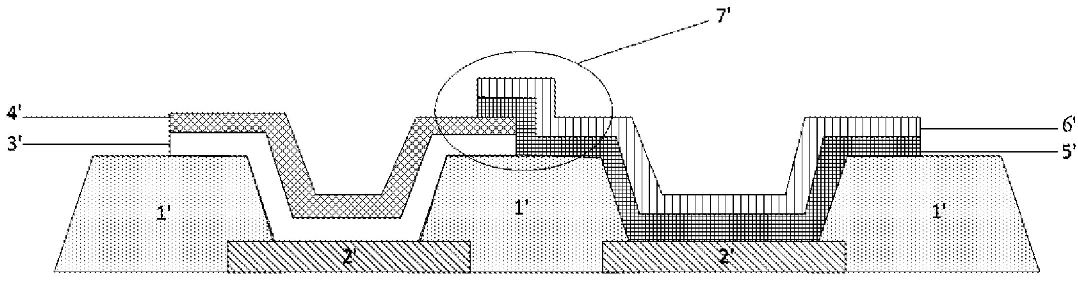
FIG. 1 is a schematic view showing a cross-sectional structure of a display substrate in the related art.

In the related art, for the OLED display substrate, pixels of three colors are sequentially prepared by a specific vapor deposition. In the vapor deposition process, it will inevitably cause overlapping of the light function layers in pixels of different colors. As shown in FIG. 1, the OLED display substrate in the related art includes: a pixel defining layer 1', an anode layer 2', a first hole transport layer 3', a first light emitting layer 4', a second hole transport layer 5', a second light emitting layer 6', and a contact part 7' of the second hole transport layer 5' in contact with the light function layer of the first pixel. The light function layer includes a first hole transport layer 3' and a light emitting layer 4'. When the excited state energy level structure of the second hole transport layer 5' in the second pixel matches that of the first hole transport layer 3' or the first light emitting layer 4' in the first pixel, or has relatively strong carrier transport ability to the hole transport layer 3' of the first pixel, the holes generated in the second pixel are transmitted to the light function layer of the first pixel through the light function layer at the contact position and radiate light, resulting in the display panel under the monochrome picture to emit light of other color. In addition, it should be noted that the base substrate is not shown in the drawings of the specification of the present disclosure.

An embodiment of the present disclosure provides a display substrate, including a base substrate, a pixel definition layer located on the base substrate, and a first pixel and a second pixel that are adjacent to each other and defined by the pixel definition layer, in which the first pixel includes a light function layer including a first hole transport layer, and the second pixel includes a second hole transport layer, and in which a spacer function layer for blocking hole transport between adjacent pixels is arranged at at least a part of a contact interface between the second hole transport layer and the light function layer.

It should be noted that in the present disclosure, the first pixel refers to a pixel prepared first, and the second pixel refers to a pixel prepared later, because the preparation sequence of adjacent pixels is usually different.

According to an embodiment of the present disclosure, the display substrate includes a first pixels and a second pixel that are adjacent to each other, and a spacer function layer is provided at the contact interface between the second hole transport layer and the light function layer. Optionally, the light function layer includes a first hole transport layer and a first light emitting layer.

The contact interface described herein refers to the interface where the second hole transport layer is in contact with the light function layer in absence of a spacer function layer. When the light function layer only includes the first hole transport layer, the contact interface refers to the interface where the second hole transport layer is in contact with the first hole transport layer. When the light function layer includes a first hole transport layer and a first light emitting layer, the contact interface refers to an interface where the second hole transport layer is in contact with both the first hole transport layer and the first light emitting layer. Therefore, the embodiment according to the present disclosure includes two specific situations: a spacer function layer is arranged at the interface where the second hole transport layer is in contact with the first hole transport layer; and a spacer function layer is arranged at the interface where the second hole transport layer is in contact with both the first hole transport layer and the first light emitting layer. The arrangement of the spacer function layer can effectively block transferring holes from the second pixel to the first pixel.

Optionally, the spacer function layer is arranged at the whole contact interface between the second hole transport layer and the light function layer.

Figure 2:
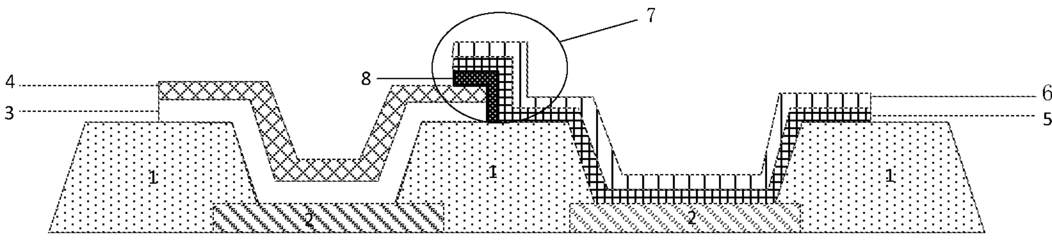
FIG. 2 is a schematic view showing a cross-sectional structure of a display substrate according to an embodiment of the present disclosure.
Figure 3:
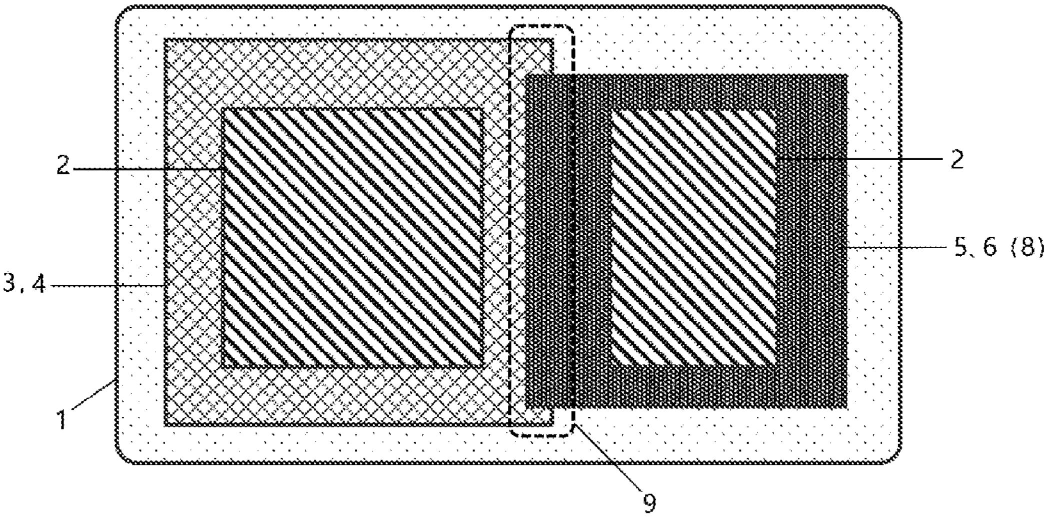
FIG. 3 is a top view showing a display substrate according to an embodiment of the present disclosure.

As shown in FIGS. 2 and 3, the display substrate includes a first pixel and a second pixel that are adjacent to each other. The first pixel includes a pixel definition layer 1, an anode layer 2, a first hole transport layer 3, and a first light emitting layer. 4; the second pixel includes a pixel definition layer 1, an anode layer 2, a second hole transport layer 5, and a second light emitting layer 6; the first pixel and the second pixel overlap and have an overlap area 9, and the second hole transport layer 5 and the light function layer of the first pixel have a contact interface part 7; and a spacer function layer 8 is arranged between the second hole transport layer 5 and the light function layer. The spacer function layer 8 is configured to block hole transport between adjacent pixels. Optionally, the light function layer includes at least a first hole transport layer 3. Optionally, the light function layer may include a first hole transport layer 3 and a first light emitting layer 4.

According to the embodiment of the present disclosure, the arrangement of the spacer function layer specifically includes the following three types.

In the first arrangement, the spacer function layer is arranged between the anode of the second pixel and the second hole transport layer.

The spacer function layer is in contact with the first light emitting layer and the first hole transport layer. Given the hole transport performance, optionally, a difference between the HOMO energy level of the spacer function layer and an HOMO energy level of the first hole transport layer is greater than 0.3 eV, a difference between the HOMO energy level of the spacer function layer and an HOMO energy level of the first light emitting layer is greater than 0.3 eV, and differences between the HOMO energy level of the spacer function layer and HOMO energy levels of the second light emitting layer as well as the second hole transport layer in the second pixel are both less than or equal to 0.3 eV.

In the second arrangement, the spacer function layer is arranged on the surface of the first light emitting layer away from the first hole transport layer.

The spacer function layer is in contact with the second hole transport layer, and a part of the second hole transport layer is arranged on the surface of the spacer function layer away from the base substrate.

In the third arrangement, the spacer function layer is arranged between the first light emitting layer and the first hole transport layer.

The spacer function layer is in contact with the second hole transport layer. Optionally, a part of the second hole transport layer is arranged on a surface of the first light emitting layer away from the base substrate. Optionally, an orthogonal projection of the spacer function layer on the base substrate covers an orthogonal projection of the first light emitting layer on the base substrate, and the area of the orthogonal projection of the spacer function layer on the base substrate is greater than the area of the orthogonal projection of the first light emitting layer on the base substrate.

In the third arrangement, the spacer function layer covers a surface of the first hole transport layer. In view of the relatively small thickness of the hole transport layer, the first hole transport layer is optionally not covered by the spacer function layer in the thickness direction, and the accompanying luminescence phenomenon will not occur significantly.

In the second and third arrangements, optionally, a difference between the HOMO energy level of the spacer function layer and an HOMO energy level of the second hole transport layer is greater than 0.3 eV, and differences between the HOMO energy level of the spacer function layer and HOMO energy levels of the first light emitting layer as well as the first hole transport layer are both less than or equal to 0.3 eV.

In an embodiment of the present disclosure, the spacer function layer may have a thickness less than 10 nm. The spacer function layer can be made of a material having a decomposition temperature not less than 350° C., a hole mobility in a range from $10^{-5}$ to $10^{-3}$ $cm^2$ $v^{-1}s^{-1}$, and an electron mobility less than $10^{-9}$ $cm^2$ $v^{-1}s^{-1}$ and capable of forming a dense thin film without pinholes.

Optionally, the spacer function layer can be made of a material selected from aromatic amines and their derivatives, cross-structured diamine biphenyl derivatives or oxazole derivatives. Optionally, the spacer function layer is made of at least one material of NPB, spiro-TAD and PBD.

NPB (N,N'-Bis-(1-naphthalenyl)-N,N'-bis-phenyl-(1,1'-biphenyl)-4,4'-diamine) is a hole transport material commonly used in OLED, and the specific structure thereof is shown in following Formula I. The NPB material is easy to synthesize and simple to purify, has excellent thermal stability. The NPB can form a dense amorphous film, and has an HOMO energy level of −5.5 eV.

(I)

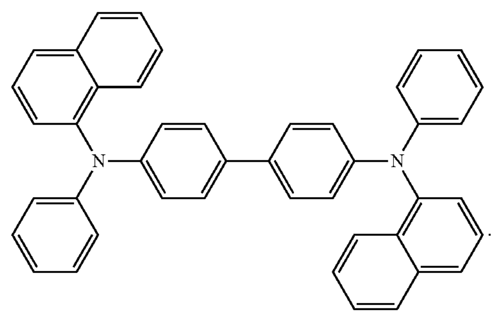

The specific structure of spiro-TAD (2,2',7,7'-tetrakis(diphenylamino)-9,9'-spirobifluorene) is shown in the following formula II. The material is simple to synthesize and purify, has a high glass transition temperature. The spiro-TAD forms a stable amorphous state during the evaporation process.

(II)

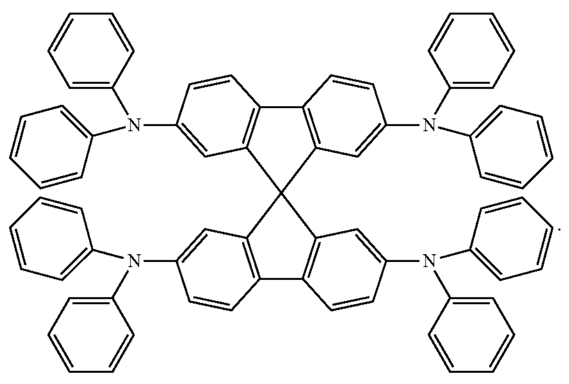

The specific structure of PBD (2-(4-biphenylyl)-5-(4-tert-butylphenyl)-1,3,4-oxadiazole) is shown in the following formula III. PBD is not only a hole blocking material commonly used but also an electron transport material. Its HOMO and LUMO energy levels are 6.06 eV and 2.16 eV, respectively, and have high thermal stability.

(III)

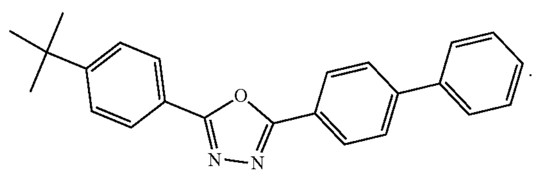

Optionally, the spacer function layer is in contact with the pixel definition layer and is arranged only between the first hole transport layer and the second hole transport layer; and the second hole transport layer is only in contact with the first light emitting layer rather than the first hole transport layer in a direction parallel to a surface of the base substrate.

According to an embodiment of the present disclosure, a method for preparing a display substrate is disclosed, including: forming an anode layer and a pixel definition layer on a base substrate, in which the pixel definition layer defines a first pixel area and a second pixel area that are adjacent to each other; sequentially forming a first hole transport layer and a first light emitting layer of the first pixel on the anode layer in the first pixel area; forming a spacer function layer for blocking hole transport between adjacent pixels, in which the spacer function layer at least covers an edge area of the light function layer in the first pixel proximate to the second pixel, and the light function layer at least includes the first hole transport layer; and sequentially forming a second hole transport layer and a second light emitting layer of the second pixel on the anode layer in the second pixel area.

In the embodiments of the present disclosure, the base substrate may be a TFT substrate. An anode layer and a pixel definition layer are formed on the base substrate, and the pixel definition layer defines a plurality of pixel areas. The anode layer and the pixel definition layer can be formed according to the method in the related art, which is not specifically limited in the present disclosure. In each pixel area, an anode layer is provided.

The first pixel is a pixel of which a light function layer is prepared first. A plurality of first pixels can be simultaneously formed on the base substrate as required. A first hole transport layer and a first light emitting layer of the first pixel are sequentially formed on the anode layer in the first pixel area. The method for forming the first hole transport layer and the first light emitting layer may be vapor deposition, printing, or the like. If it is formed by vapor deposition, the first hole transport layer and the first light emitting layer are prone to misalignment, because the vapor deposition chambers thereof are different. The method for preparing the display substrate according to embodiments of the present disclosure includes a case where the first hole transport layer and the first light emitting layer are misaligned.

A spacer function layer for blocking hole transport between adjacent pixels is formed. The spacer function layer at least covers the edge area of the light function layer of the first pixel proximate to the second pixel. The spacer function layer may be in contact with the second hole transport layer formed later, to prevent the second hole transport layer from contacting the light function layer. The second pixel is adjacent to the first pixel.

The light function layer may be a first hole transport layer, or a first hole transport layer and a first light emitting layer.

Since the hole mobility of the second hole transport layer is usually more than 1000 times greater than that of the first light emitting layer, even if the second hole transport layer is in contact with the first light emitting layer, the crosstalk caused by this part of the hole leakage can also be ignored. Therefore, the spacer function layer at least covers the edge of the first hole transport layer proximate to the second pixel, so as to avoid overlapping contact between the first hole transport layer and the second hole transport layer, thereby blocking the hole transport of adjacent pixels.

Given the feasibility and simplicity of the preparation method, the spacer function layer completely covers the first hole transport layer. Specifically, the method for preparing the display substrate includes: forming a spacer function layer on the surface of the first hole transport layer after forming the first hole transport layer of the first pixel, in which the spacer function layer covers the first hole transport layer.

In order to achieve a better effect of avoiding crosstalk, optionally, the spacer function layer at least covers the edge areas of the first hole transport layer and the first light emitting layer. Given the feasibility and simplicity of the preparation method, the spacer function layer completely covers the first hole transport layer and the first light emitting layer. Specifically, the method for preparing the display substrate includes: forming the spacer function layer on the surface of the first hole transport layer after forming the first light emitting layer of the first pixel, in which the spacer function layer covers the first light emitting layer and the first hole transport layer.

In the embodiment of the present disclosure, the second pixel is a pixel formed later. Due to the alignment problem, it is inevitable to form contact with the light function layer of the first pixel.

According to the embodiment of the present disclosure, the second hole transport layer and a second light emitting layer of the second pixel is sequentially formed on the anode layer in the second pixel area. The spacer function layer may also be formed in the second pixel area. That is, after the light emitting layer of the first pixel is formed, a spacer function layer is formed on the anode layer in the second pixel area, and then the second hole transport layer and the second light emitting layer of the second pixel are sequentially formed on the spacer function layer.

The spacer function layer covers the edge area of the first hole transport layer and the first light emitting layer proximate to the second pixel, to block the second hole transport layer from contacting the light function layer of the first pixel.

In view of the fact that the electron transport layer and the cathode of the plurality of sub-pixels are formed as a whole layer, there is no need for the sub-pixels to form the electron transport layer and the cathode layer separately. Therefore, the methods for preparing the electron transport layer and the cathode will not be repeated.

The embodiment of the present disclosure also discloses a display device including the display substrate according to any one of the above embodiments. For example, the display device may be display panels, mobile phones, computers, etc.

In order to further understand the present disclosure, the display substrate, the method for preparing the same and the display device including the display substrate will be described detailedly in conjunction with the following Examples below. The protection scope of the present disclosure is not limited by the following Examples.

EXAMPLE

Example 1

An anode layer and a pixel definition layer are formed on the base substrate, and the pixel definition layer defines a plurality of pixel areas. The plurality of pixel areas includes a first pixel area and a second pixel area that are adjacent to each other. A first hole transport layer is vapor-deposited on the anode layer in the first pixel area, and a first light emitting layer is vapor-deposited on a surface of the first hole transport layer.

A spacer function layer is vapor-deposited on the anode layer in adjacent second pixel areas, and then undoped or doped second hole transport layer and second light emitting layer are sequentially vapor-deposited on the spacer function layer. A difference between the HOMO energy level of the spacer function layer and an HOMO of the second hole transport layer is less than or equal to 0.3 eV, and differences between the HOMO energy level of the spacer function layer and an HOMO energy level of the first light emitting layer as well as the first hole transport layer are both great than 0.3 eV.

Figure 4:
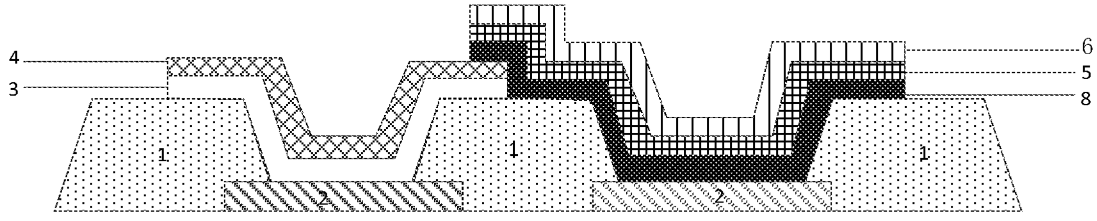
FIG. 4 is a schematic view showing a cross-sectional structure of a display substrate according to another embodiment of the present disclosure.

The structure of the display substrate prepared according to this embodiment is referred to FIG. 4 for details. The display substrate shown in FIG. 4 includes a pixel definition layer 1, an anode layer 2, a first hole transport layer 3, a first light emitting layer 4, a second hole transport layer 5, a second light emitting layer 6 and a spacer function layer 8. The base substrate, the electron transport layer and the cathode are not shown in FIG. 4.

When a driving voltage is applied to the second pixel, holes are injected from the anode 2 and transported to the hole transport layer 5, and the holes rapidly migrate from the hole transport layer 5 to the contact interface 7. Due to the existence of the spacer function layer 8, the spacer function layer 8 can prevent holes from migrating to the light emitting layer 4 or the hole transport layer 3 of the first pixel in contact therewith, thereby avoiding the situation where holes recombine with electrons in the first pixel to emit light.

Example 2

An anode layer and a pixel definition layer are formed on the base substrate, and the pixel definition layer defines a plurality of pixel areas. The plurality of pixel areas includes a first pixel area and a second pixel area that are adjacent to each other. A first hole transport layer is vapor-deposited on the anode layer in the first pixel area, and a first light emitting layer is vapor-deposited on a surface of the first hole transport layer. Then, a spacer function layer is vapor-deposited on the first light emitting layer, and the spacer function layer can cover the first hole transport layer and the first light emitting layer by adjusting a size of a mask.

Undoped or doped second hole transport layer and second light emitting layer are vapor-deposited on the anode layer in the adjacent second pixel areas. A difference between the HOMO energy level of the spacer function layer and an HOMO energy level of the second hole transport layer is greater than 0.3 eV, and differences between the HOMO energy level of the spacer function layer and HOMO energy levels of the first light emitting layer as well as the first hole transport layer are both less than or equal to 0.3 eV.

Figure 5:
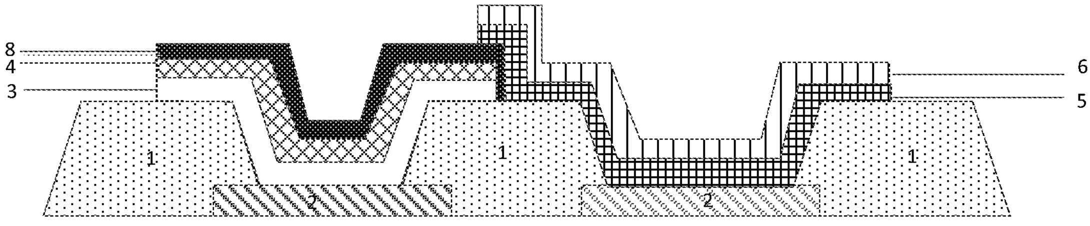
FIG. 5 is a schematic view showing a cross-sectional structure of a display substrate according to a still another embodiment of the present disclosure.

The structure of the display substrate prepared in this embodiment is referred to FIG. 5 for details. The display substrate shown in FIG. 5 includes a pixel defining layer 1, an anode layer 2, a first hole transport layer 3, a first light emitting layer 4, a second hole transport layer 5, a second light emitting layer 6 and a spacer function layer 8.

Figure 6:
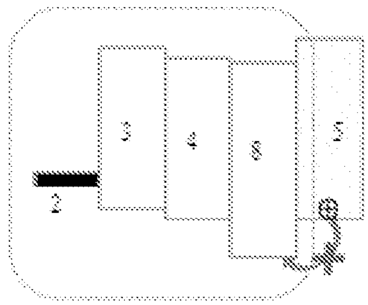
FIG. 6 is a schematic view showing the working mechanism of a display substrate prepared according to another embodiment of the present disclosure.

FIG. 6 is a schematic view showing the working mechanism of a display substrate prepared according to this embodiment. When a driving voltage is applied to the second pixel, holes are injected from the anode 2 and transported to the hole transport layer 5, and the holes rapidly migrate from the hole transport layer 5 to the contact interface 7. Due to the existence of the spacer function layer 8, the spacer function layer 8 can block the migration of holes to the light emitting layer or the hole transport layer of the first pixel in contact therewith. It is difficult for the hole carriers at the contact interface to transition to the HOMO energy level of the spacer function layer, thereby avoiding the situation that holes combine with electrons to emit light in the first pixel.

Example 3

An anode layer and a pixel definition layer are formed on the base substrate, and the pixel definition layer defines a plurality of pixel areas. The plurality of pixel areas includes a first pixel area and a second pixel area that are adjacent to each other. A first hole transport layer is vapor-deposited on the anode layer in the first pixel area. Then, in the case of inconvenient vapor deposition and alignment, in the same chamber, a spacer function layer is vapor deposited on the surface of the first hole transport layer. The spacer function layer completely covers the first hole transport layer. Then, a first light emitting layer is vapor-deposited on the spacer function layer.

Undoped or doped second hole transport layer and second light emitting layer are vapor-deposited on the anode layer in the adjacent second pixel areas. A difference between the HOMO energy level of the spacer function layer and an HOMO energy level of the second hole transport layer is greater than 0.3 eV, and differences between the HOMO energy level of the spacer function layer and HOMO energy levels of the first light emitting layer as well as the first hole transport layer are both less than or equal to 0.3 eV.

Figure 7:
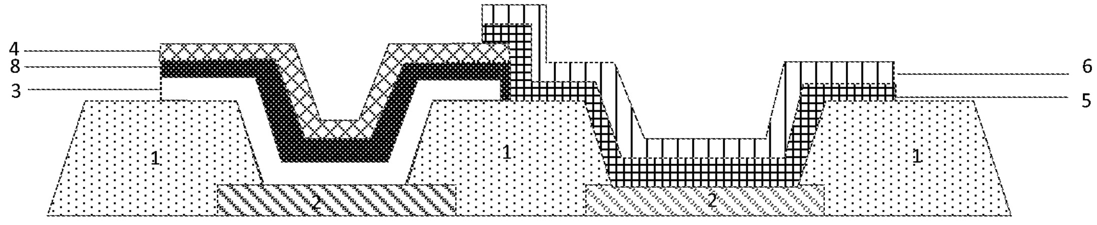
FIG. 7 is a schematic view showing a cross-sectional structure of a display substrate according to a still another embodiment of the present disclosure.

The structure of the display substrate prepared in this embodiment is referred to FIG. 7 for details. The display substrate shown in FIG. 7 includes a pixel definition layer 1, an anode layer 2, a first hole transport layer 3, a first light emitting layer 4, a second hole transport layer 5, a second light emitting layer 6 and a spacer function layer 8.

Figure 8:
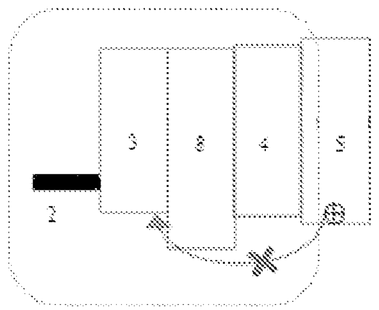
FIG. 8 is a schematic view showing the working mechanism of a display substrate prepared according to still another embodiment of the present disclosure.

FIG. 8 is a schematic view showing the working mechanism of a display substrate prepared according to this embodiment. When a driving voltage is applied to the second pixel, holes are injected from the anode 2 and transported to the hole transport layer 5, and the holes rapidly migrate from the hole transport layer 5 to the contact interface 7. Due to the existence of the spacer function layer 8, the spacer function layer 8 can block the migration of holes to the light emitting layer or the hole transport layer of the first pixel in contact therewith. It is difficult for the hole carriers at the contact interface to transition to the HOMO energy level of the spacer function layer, thereby avoiding the situation that holes combine with electrons to emit light in the first pixel.

In this Example, the contact between the hole transport layer 5 of the second pixel and the light emitting layer 4 of the first pixel will cause hole leakage, but the hole mobility of the hole transport layer 5 of the second pixel is usually 1000 times greater than the hole mobility of the light emitting layer 4 of the first pixel, so that the crosstalk caused by the hole leakage in this part is negligible.

Example 4

An anode layer and a pixel definition layer are formed on the base substrate, and the pixel definition layer defines a plurality of pixel areas. The plurality of pixel areas includes a first pixel area and a second pixel area that are adjacent to each other. A first hole transport layer is vapor-deposited on the anode layer in the first pixel area. Then, in the case of inconvenient vapor deposition and alignment, in the same chamber, a spacer function layer is vapor deposited on the surface of the first hole transport layer. The spacer function layer covers the surface of the first hole transport layer, and the surface of the first hole transport layer in the thickness direction does not cover the spacer function layer. Then, the chamber is replaced, and a first light emitting layer is vapor-deposited on the spacer function layer. Due to the replacement of the chamber, the first light emitting layer may be misaligned to the spacer function layer.

Non-doped or doped second hole transport layer and second light emitting layer are vapor-deposited on the anode layer in the adjacent second pixel areas. Optionally, an difference between the HOMO energy level of the spacer function layer and an HOMO energy level of the second hole transport layer is greater than 0.3 eV, and differences between the HOMO energy level of the spacer function layer and HOMO energy levels of the first light emitting layer as well as the first hole transport layer are both less than or equal to 0.3 eV.

Figure 9:
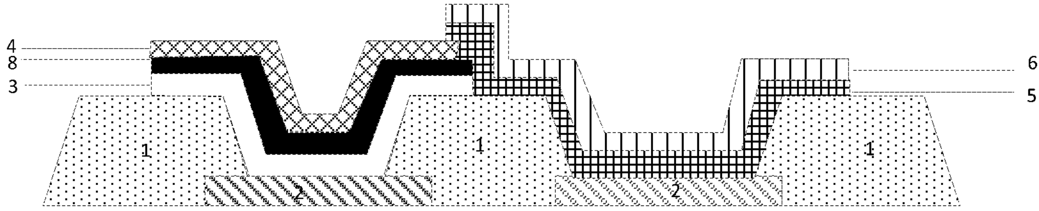
FIG. 9 is a schematic view showing a cross-sectional structure of a display substrate according to a still another embodiment of the present disclosure.

The structure of the display substrate prepared in this embodiment is referred to FIG. 9 for details. The display substrate shown in FIG. 9 includes a pixel definition layer 1, an anode layer 2, a first hole transport layer 3, a first light emitting layer 4, a second hole transport layer 5, a second light emitting layer 6 and a spacer function layer 8.

When a driving voltage is applied to the second pixel, holes are injected from the anode and transported to the hole transport layer 5, and the holes quickly migrate from the hole transport layer 5 to the contact interface 7. Due to the existence of the spacer function layer 8, the spacer function layer 8 can block the migration of holes to the light emitting layer 4 or the hole transport layer 5 of the first pixel in contact therewith. It is difficult for the hole carriers at the contact interface to transition to the HOMO energy level of the spacer function layer, thereby avoiding the situation that holes combine with electrons to emit light in the first pixel.

In this Example, the contact between the hole transport layer 5 of the second pixel and the light emitting layer 4 of the first pixel will cause hole leakage, but the hole mobility of the hole transport layer 5 of the second pixel is usually 1000 times greater than the hole mobility of the light emitting layer 4 of the first pixel, so that the crosstalk caused by the hole leakage in this part is negligible.

The description of the above Examples is merely used for helping to understand the technical solutions of the present disclosure and inventive concepts thereof. It should be noted that a person skilled in the art may make further improvements and modifications to the disclosure without departing from the principle/spirit of the present disclosure, and these improvements and modifications shall also fall within the scope of the present disclosure.

What is claimed is:

1. A display substrate, comprising a base substrate, a pixel definition layer located on the base substrate, a first subpixel and a second subpixel that are adjacent to each other and defined by the pixel definition layer, and a spacer function layer for blocking hole transport between adjacent subpixels which extends to a pixel area of only one subpixel of the first subpixel and the second subpixel, and completely covers a light emitting area of the one subpixel, but does not cover the light emitting area of the other subpixel, wherein the pixel definition layer comprises a plurality of openings, the plurality of openings comprises a first opening and a second opening, the first subpixel is located at a position corresponding to the first opening and the second subpixel is located at a position corresponding to the second opening, the first subpixel comprises a first hole transport layer, the second subpixel comprises a second hole transport layer, the first hole transport layer and the second hole transport layer are arranged on a side of the pixel definition layer away from the base substrate, the spacer function layer is arranged between the first hole transport layer and the second hole transport layer and is at least arranged between the first opening and the second opening, and the first hole transport layer and the second hole transport layer are not connected in a position arranged with the spacer function layer, a material of the spacer function layer is different from that of the first hole transport layer and the second hole transport layer.

2. The display substrate of claim 1, wherein the spacer function layer comprises an upper surface away from the base substrate and a lower surface proximate to the base substrate, and an area of an orthogonal projection of the upper surface on the base substrate is larger than an area of an orthogonal projection of the lower surface on the base substrate.

3. The display substrate of claim 2, wherein the orthogonal projection of the lower surface of the spacer function layer on the base substrate is located inside the orthogonal projection of the upper surface of the spacer function layer on the base substrate.

4. The display substrate of claim 1, wherein in a section perpendicular to the base substrate, the spacer function layer arranged between the first opening and the second opening comprises side surfaces between the upper surface and the lower surface, the side surfaces comprises a first side surface proximate to the first subpixel and a second side surface proximate to the second subpixel, the first side surface is in direct contact with the first hole transport layer and the second side surface is in direct contact with the second hole transport layer.

5. The display substrate of claim 1, wherein an orthogonal projection of the hole transport part on the base substrate partially overlaps with an orthogonal projection of the first hole transport layer on the base substrate.

6. The display substrate of claim 1, wherein a thickness of the spacer function layer arranged between the first opening and second opening in a direction perpendicular to the base substrate is larger than a thickness of the first hole transport layer in the direction perpendicular to the base substrate.

7. The display substrate of claim 1, wherein a color emitted by the first subpixel is different from a color emitted by the second subpixel.

8. The display substrate of claim 1, wherein in a section perpendicular to the base substrate, a size of the first opening is different from a size of the second opening.

9. The display substrate of claim 1, wherein the first subpixel further comprises a first light emitting layer, the spacer function layer is in direct contact with the first hole transport layer and the first light emitting layer, and in direct contact with the second hole transport layer.

10. The display substrate of claim 9, wherein the spacer function layer is arranged between an anode of the second subpixel and the second hole transport layer, the spacer function layer is in contact with the first hole transport layer and the first light emitting layer, and the spacer function layer is arranged on a surface of the first light emitting layer away from the base substrate, a difference between an HOMO energy level of the spacer function layer and an HOMO energy level of the first hole transport layer is greater than 0.3 eV, and differences between the HOMO energy level of the spacer function layer and HOMO energy levels of the second light emitting layer as well as the second hole transport layer in the second subpixel are both less than or equal to 0.3 eV.

11. The display substrate of claim 9, wherein the spacer function layer is arranged on a surface of the first light emitting layer away from the first hole transport layer and between the second hole transport layer and the first hole transport layer as well as the first light emitting layer, and a part of the second hole transport layer is arranged on a surface of the spacer function layer away from the base substrate, a difference between an HOMO energy level of the spacer function layer and an HOMO energy level of the second hole transport layer is greater than 0.3 eV, and differences of the HOMO energy level between the spacer function layer and HOMO energy levels of the first light emitting layer as well as the first hole transport layer are both less than or equal to 0.3 eV.

12. The display substrate of claim 9, wherein the spacer function layer is arranged between the first light emitting layer and the first hole transport layer and between the first hole transport layer and the second hole transport layer, and the spacer function layer is in contact with the second hole transport layer, a difference between an HOMO energy level of the spacer function layer and an HOMO energy level of the second hole transport layer is greater than 0.3 eV, and differences between the HOMO energy level of the spacer function layer and HOMO energy levels of the first light emitting layer as well as the first hole transport layer are both less than or equal to 0.3 eV.

13. The display substrate of claim 9, wherein the spacer function layer is in contact with the pixel definition layer and arranged only between the first hole transport layer and the second hole transport layer; and wherein the second hole transport layer is only in contact with the first light emitting layer rather than the first hole transport layer in a direction parallel to a surface of the base substrate.

14. The display substrate of claim 1, wherein the spacer function layer is made of a material having a decomposition temperature not less than 350° C., a hole mobility in a range from $10^{-5}$ to $10^{-3}$ $cm^2$ $v^{-1}s^{-1}$, and an electron mobility less than $10^{-9}$ $cm^2$ $v^{-1}s^{-1}$, the spacer function layer is made of at least one material selected from N,N'-Bis-(1-naphthalenyl)-N,N'-bis-phenyl-(1,1'-biphenyl)-4,4'-diamine (NPB), 2,2',7,7'-tetrakis-(diphenylamino)-9,9'-spirobifluorene (spiro-TAD) and 2-(4-biphenylyl)-5-(4-tert-butylphenyl)-1,3,4-oxadiazole (PBD).

15. A method for preparing a display substrate, comprising:

forming an anode layer and a pixel definition layer on a base substrate, wherein the pixel definition layer defines a first subpixel area and a second subpixel area that are adjacent to each other, the pixel definition layer comprises a plurality of openings, the plurality of openings comprises a first opening and a second opening, the first subpixel area is located at a position corresponding to the first opening and the second subpixel area is located at a position corresponding to the second opening;

sequentially forming a first hole transport layer and a first light emitting layer of the first subpixel on the anode layer in the first subpixel area;

forming a spacer function layer for blocking hole transport between adjacent subpixels; and sequentially forming a second hole transport layer and a second light emitting layer of the second subpixel on the anode layer in the second subpixel area, wherein the spacer function layer is arranged between the first hole transport layer and the second hole transport layer and is at least arranged between the first opening and the second opening, the spacer function layer at least covers an edge area of the first hole transport layer of the first subpixel proximate to the second subpixel, so that the first hole transport layer and the second hole transport layer are not connected in a position arranged with the spacer function layer, a material of the spacer function layer is different from that of the first hole transport layer and the second hole transport layer, and wherein the spacer function layer extends to a pixel area of only one subpixel of the first subpixel and the second subpixel, and completely covers a light emitting area of the one subpixel, but does not cover the light emitting area of the other subpixel.

16. The method of claim 15, wherein the spacer function layer comprises an upper surface away from the base substrate and a lower surface proximate to the base substrate, and an area of an orthogonal projection of the upper surface on the base substrate is larger than an area of an orthogonal projection of the lower surface on the base substrate, and the orthogonal projection of the lower surface on the base substrate is located inside the orthogonal projection of the upper surface on the base substrate.

17. The method of claim 15, wherein in a section perpendicular to the base substrate, the spacer function layer arranged between the first opening and the second opening comprises side surfaces between the upper surface and the lower surface, the side surfaces comprises a first side surface proximate to the first subpixel and a second side surface proximate to the second subpixel, the first side surface is in direct contact with the first hole transport layer and the second side surface is in direct contact with the second hole transport layer.

18. The display substrate of claim 1, further comprising a hole transport part arranged on a side of the spacer function layer away from the base substrate and arranged between the first opening and the second opening, wherein a material of the hole transport part is the same with that of the second hole transport layer, and wherein the upper surface of the spacer function layer away from the base substrate is in direct contact with the hole transport part, and the hole transport part is separated with the first hole transport layer.

19. The method of claim 15, further comprising forming a hole transport part on a side of the spacer function layer away from the base substrate and between the first opening and the second opening, wherein a material of the hole transport part is the same with that of the second hole transport layer, wherein the upper surface of the spacer function layer away from the base substrate is in direct contact with the hole transport part, and the hole transport part is separated with the first hole transport layer, and wherein an orthogonal projection of the hole transport part on the base substrate partially overlaps with an orthogonal projection of the first hole transport layer on the base substrate.

* * * * *